US007599069B2

(12) United States Patent
Toussaint, Jr. et al.

(10) Patent No.: US 7,599,069 B2
(45) Date of Patent: Oct. 6, 2009

(54) VECTOR BEAM GENERATOR USING A PASSIVELY PHASE STABLE OPTICAL INTERFEROMETER

(75) Inventors: Kimani C. Toussaint, Jr., Chicago, IL (US); Norbert F. Scherer, Winnetka, IL (US); Justin E. Jureller, Chicago, IL (US); Sungnam Park, Chicago, IL (US)

(73) Assignee: The University of Chicago, Chicago, IL (US)

( * ) Notice: Subject to any disclaimer, the term of this patent is extended or adjusted under 35 U.S.C. 154(b) by 378 days.

(21) Appl. No.: 11/418,694

(22) Filed: May 5, 2006

(65) Prior Publication Data

US 2006/0268408 A1 Nov. 30, 2006

Related U.S. Application Data

(60) Provisional application No. 60/678,344, filed on May 6, 2005.

(51) Int. Cl.
*G01B 9/02* (2006.01)
(52) U.S. Cl. .......................................... 356/491; 353/20
(58) Field of Classification Search ................. 356/491, 356/484, 453; 355/53; 359/483, 485–498
See application file for complete search history.

(56) References Cited

U.S. PATENT DOCUMENTS 5,018,861 A * 5/1991 Remo ........................ 356/491

| 6,236,507 B1 * | 5/2001 | Hill et al. ................ 359/494 |
| 2004/0001394 A1 | 1/2004 | Challener et al. |
| 2004/0218477 A1 | 11/2004 | Belser et al. |
| 2005/0041950 A1 | 2/2005 | Rottmayer et al. |
| 2005/0052771 A1 | 3/2005 | Rausch et al. |
| 2005/0078565 A1 | 4/2005 | Peng et al. |
| 2005/0195480 A1 | 9/2005 | Brown et al. |
| 2006/0238865 A1 * | 10/2006 | Biss et al. ................ 359/487 |

OTHER PUBLICATIONS

4Pi-Microscopy . . . provides 3D-resolution in the 100 nm range, May 2005, www.mpibpc.gwdg.de/abteilungen/200/4Pi.htm (3 pages).
Biss et al., "Primary aberrations in focused radially polarized vortex beams," Optics Express 12(3):384-393 (2004).

(Continued)

*Primary Examiner*—Tarifur Chowdhury
*Assistant Examiner*—Jonathon D Cook
(74) *Attorney, Agent, or Firm*—Marshall, Gerstein & Borun LLP

(57) ABSTRACT

Provided are techniques for generating optical vector beams (e.g., radially and azimuthally polarized light) using passive or active phase stable optical interferometry. Techniques may split an input optical beam into at least two output beams, and then couple those beams simultaneously into a passively phase stable optical interferometer. Beam splitting may be achieved by a diffractive optical element and coupling may be achieved by a single refractive optical device (lenses) or by a single mirror device (e.g., parabolic and spherical). The interferometer may provide the ability to manipulate (or transform) the polarization of part of the wavefront of each beam, as well as the ability to manipulate (or transform) the phase of part of the wavefront of each beam, such that the beams when combined have a vector beam polarization state.

26 Claims, 12 Drawing Sheets

OTHER PUBLICATIONS

Dorn et al., "Focusing a radially polarized light beam to a significantly smaller spot size," Physics, 1-4 (2003).
First Photographs of the Entangled Photon Source: Type-II Downconversion from BBO, May 2005 www.tongue-twister.net/mr/physics/bbo_photon.htm (4 pages).
Goubet et al., Detecting Fluorescent Dyes on 1-D Polyacrylamide Gels using CCD-based Technology as Compared to Laser Screening, Geneomics & Proteomics, May 2005, www.genpromag.com (2 pages).
Macklin et al., "Imaging and Time-Resolved Spectroscopy of Single Molecules at an Interface," Science 272, 255-258 (1996).
Microscopy turning Nanoscopy, May 2005, www.uchsc.edu/lightmicroscopy/sted4pi.htm, 3 pages.
Oron, et al., "The formation of laser beams with pure azimuthal or radial polarization," Applied Physics Letters, 77(21):3322-3324 (2000).
Schu et al., "Microscopy Researchers are Redefining their Images," Genomics & Proteomics, 5 pages (2004).
Toussaint, et al., "Generation of optical vector beams with a diffractive optical element interferometer" Opt. Lett. 30, 2846-2848 (2005).
Yablonovitch et al., "Optical projection lithography at half the Rayleigh resolution limit by two-photon exposure," Opt. Eng. 38(2):334-338 (1999).
Aigouy et al., "Polarization Effects in Apertureless Scanning Near-Field Optical Microscopy: An Experimental Study," Opt. Lett , 24:187-189 (1999).
Bartko et al., "Imaging Three-Dimensional Single Molecule Orientations," J. Phys. Chem., 103: 11237-11241 (1999).
Bokor et al., "Toward a Spherical Spot Distribution with $4\pi$ Focusing of Radially Polarized Light," Opt. Lett., 29:1968-1970 (2004).
Bomzon et al., "Formation of Radially and Azimuthally Polarized Light Using Space-Variant Subwavelength Metal Stripe Gratings," Appl. Phys. Lett., 79:1587-1589 (2001).
Brixner et al., "Femtosecond Shaping of Transverse and Longitudinal Light Polarization," Opt. Lett., 29:2187-2189 (2004).
Chung et al., "Room Temperature Measurements of the 3D Orientation of Single CdSe Quantum Dots Using Polarization Microscopy," Proc. Natl. Acad. Sci. (USA), 100:405-408 (2003).
Cox et al., "Information Capacity and Resolution in an Optical System," J. Opt. Soc. Am. A, 3:1152-1158 (1986).
Dorn et al., "Sharper Focus for a Radially Polarized Light Beam," Phys. Rev. Lett., 91:233901.1-233901.4 (2003).
Engel et al., "Creating $\lambda/3$ Focal Holes with a Mach-Zehnder Interferometer," Appl. Phys. B, 77:11-17 (2003).
Fontana et al., "A High-Energy, Laser Accelerator for Electrons Using the Inverse Cherenkov Effect," J. Appl. Phys., 54:4285-4288 (1983).
Fourkas, "Rapid Determination of the Three-Dimensional Orientation of Single Molecules," Opt. Lett., 26:211-213 (2001).
Gerton et al., "Tip-Enhanced Fluorescence Microscopy at 10 Nanometer Resolution," Phys. Rev. Lett., 93:180801.1-180801.4 (2004).
Goodno et al., "Ultrafast Heterodyne-Detected Transient-Grating Spectroscopy Using Diffractive Optics," J. Opt. Soc. Am. B, 15:1791-1794 (1998).
Ha et al., "Polarization Spectroscopy of Single Fluorescent Molecules," J. Phys. Chem. B, 103:6839-6850 (1999).
Ha et al., "Single Molecule Dynamics Studied by Polarization Modulation," Phys. Rev. Lett., 77:3979-3982 (1996).
Hayazawa et al., "Detection and Characterization of Longitudinal Field for Tip-Enhanced Raman Spectroscopy," Appl. Phys. Lett., 85:6239-6241 (2004).
Hell et al., "Fundamental Improvement of Resolution with a 4Pi-Confocal Fluorescence Microscope Using Two-Photon Excitation," Opt. Comm., 93:277-282 (1992).
Ichimura et al., "Tip-Enhanced Coherent Anti-Stokes Raman Scattering for Vibrational Nanoimaging,"Phys. Rev. Lett.., 92:220801.1-220801.4 (2004).
Khalil et al., "A Phase-Sensitive Detection Method Using Diffractive Optics for Polarization-Selective Femtosecond Raman Spectroscopy," J. Phys. Chem. A, 104:5711-5715 (2000).
Kraushaar, "A Diffraction Grating Interferometer," J. Opt. Soc. Am., 40:480-481 (1950).
Lieb et al., "Single-Molecule Orientations Determined by Direct Emission Pattern Imaging," J. Opt. Soc. Am. B, 21:1210-1215 (2004).
Liu et al., "Vacuum Laser Acceleration Using a Radially Polarized $CO_2$ Laser Beam," Nucl. Instrum. Methods Phys. Res. A, 424:296-303 (1999).
Maznev et al., "Optical Heterodyne Detection of Laser-Induced Gratings," Opt. Lett., 23:1319-1321 (1998).
Neil et al., "Method for the Generation of Arbitrary Complex Vector Wave Fronts," Opt. Lett., 27:1929-1931 (2002).
Novotny et al., "Theory of Nanometric Optical Tweezers,"Phys. Rev. Lett., 79:645-648 (1997).
Park et al., "2-Dimensional Measurement of the Solvent Intermolecular Response in Solvation," Chem. Phys. 0., 557-559 (2005).
Quabis et al., "The Focus of Light—Theoretical Calculation and Experimental Tomographic Reconstruction," Appl. Phys. B, 72:109-113 (2001).
Sick et al., "Orientational Imaging of Single Molecules by Annular Illumination," Phys. Rev. Lett., 85:4482-4485 (2000).
Tidwell et al., "Generating Radially Polarized Beams Interferometrically," Appl. Opt., 29:2234-2239 (1990).
Xu et al., "Heterodyne Detected Transient Grating Spectroscopy in Resonant and Non-Resonant Systems Using a Simplified Diffractive Optics Method," Chem. Phys. Lett., 338:254-262 (2001).
Yamaguchi et al., "Liquid Crystal Polarizers with Axially Symmetrical Properties," Jpn. J. Appl. Phys., 28:1730-1731 (1989).
Youngworth et al., "Focusing of High Numerical Aperture Cylindrical-Vector Beams," Opt. Express, 7:77-87 (2000).
Youngworth et al., "Inhomogeneous Polarization in Scanning Optical Microscopy," Proc. SPIE, 3919:75-85 (2000).

* cited by examiner

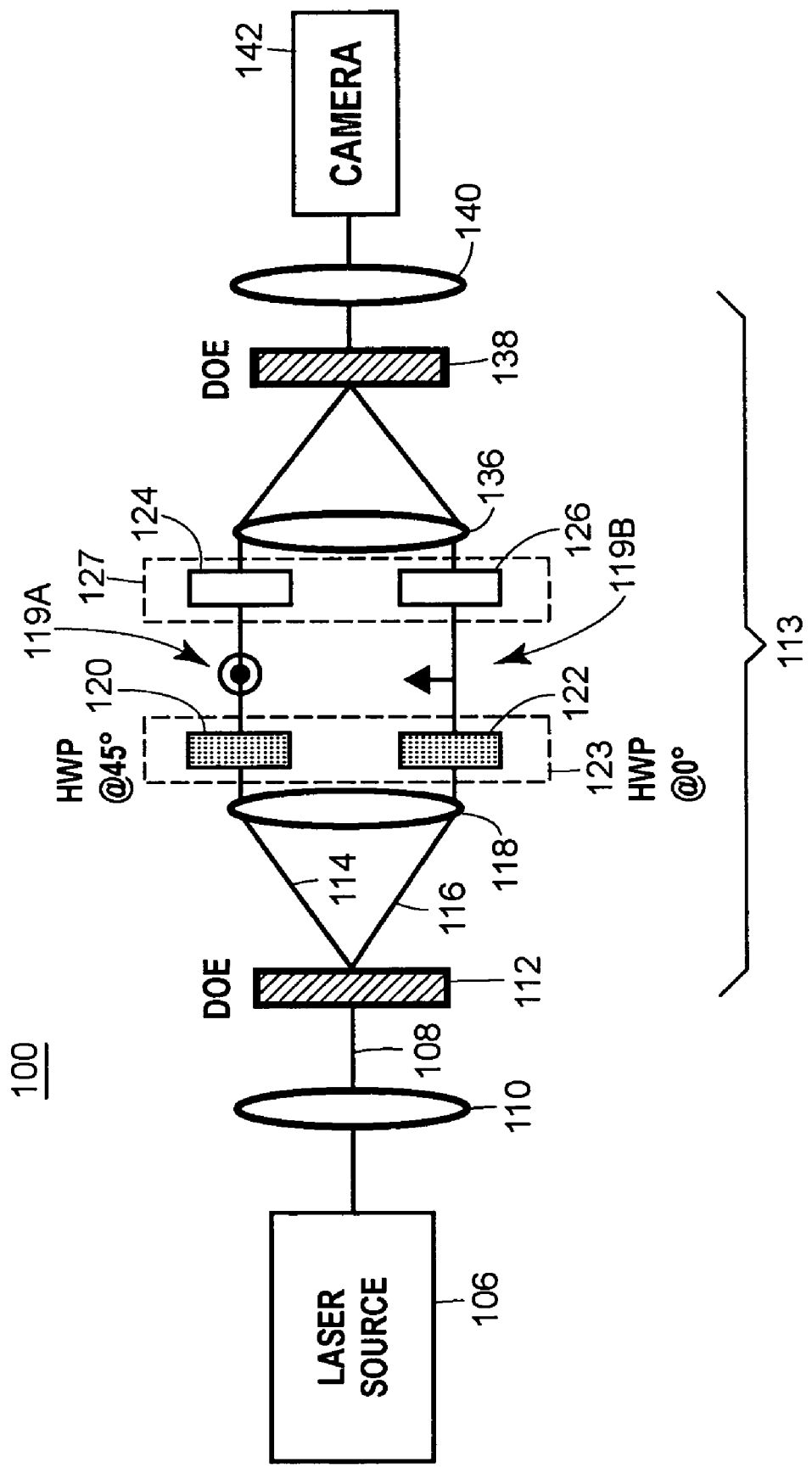

VECTOR BEAM GENERATOR USING A PASSIVELY PHASE STABLE OPTICAL INTERFEROMETER

CROSS REFERENCE TO RELATED APPLICATIONS

This application claims the benefit of U.S. Provisional Application No. 60/678,344, filed May 6, 2005, the entirety of which is expressly incorporated herein by reference.

Scientific work relating to the invention was supported by Grant Nos. CHE0321232 and CHE0317009 from the United States National Science Foundation and by Grant No. DMR0213745 from the United States National Science Foundation—Materials Research Science & Engineering Centers. The United States government may have certain rights in the invention.

BACKGROUND OF THE INVENTION

1. Field of the Invention

The invention relates generally to techniques for generating polarized light and, more particularly, to techniques for generating vector beams.

2. Background of Related Art

As known from theory and experiment, focusing systems are in general limited in their ability to focus light. This is commonly referred to as "diffraction limited focusing" and is described by conventional Abbe Diffraction theory. This conventional theory does not consider the polarization properties of the light field and their consequence on focusing. Focusing systems (e.g. microscope objectives) may be able to tightly confine focused light in a transverse focal (i.e. XY-) plane, but are less able to achieve the same spatial resolution in the axial (or Z-) direction. For many applications, this elongated focus is of little import. For other applications, however, in particular applications with features on the sub-micron and nanometer scale, this effect is quite problematic.

Recent advances in interferometric fluorescence microscopy, such as "4-Pi" confocal microscopy, have enabled overall resolution enhancements beyond the diffraction limitation mentioned above. These techniques achieve focusing resolutions known as "superresolution." Most of these techniques rely exclusively on the use of scalar polarized beams, i.e., beams that have polarizations that are uniform over their cross section. Even these techniques, however, are limited in the tightness of the focus they can achieve. As such, some have proposed using vector beams, i.e., beams that exhibit spatially nonuniform polarization.

Two types of vector beams, radially- and azimuthally-polarized light, have been proposed in theory. Such beams preserve the axial symmetry of an optical system, and are sometimes referred to as "doughnut" or "cylindrical beams" because of the phase singularity resulting in an on-axis null intensity. When focused with a high numerical-aperture (NA) lens, the radially-polarized beam may produce a predominantly longitudinally polarized (i.e., on-axis) electric field component in the focal region. An azimuthally polarized beam focused by a high-NA lens may produce a strong on-axis magnetic field component and a purely transverse electric field.

Heretofore, the techniques for forming vector beam polarized light have been limited in design and in effectiveness. One challenge to the utilization of vector beams has been the robustness of the method of generation. Separate approaches based on Mach-Zehnder interferometry or a modified laser resonator have been demonstrated, but these require costly, active phase stabilization techniques. Alternatively, a spatial light modulator (SLM) has been proposed, but that too is costly and requires the computation of a complex algorithm for the desired phase function. Also SLM's can result in undesired diffraction effects due to pixelation. Another method uses circularly polarized light and space-variant subwavelength gratings to create radially and azimuthally polarized light. This approach, however, has only demonstrated vector beams at a wavelength of 10.6 µm and has not been used to form frequencies in the visible region. Yet, another method uses specially-designed twisted nematic liquid crystal polarizers to generate radially and azimuthally polarized light. This technique has been used at visible frequencies, but is quite costly and cumbersome to fabricate.

BRIEF SUMMARY OF THE INVENTION

Provided are methods of generating optical vector beams (e.g., radially and azimuthally polarized light) using a passively phase stable optical interferometer. In an example implementation, an input optical beam is transformed into at least two beams through a process. Two of the beams simultaneously travel through (and are therefore directed by) the same refractive optics (lenses) and along parallel beam paths before recombination. Alternatively, the two beams may be simultaneously directed by the same mirrors (e.g., parabolic and spherical) and travel along parallel beam paths before recombination. The interferometer provides the ability to manipulate (or transform) the polarization of part of the wavefront of each beam. The system further includes the ability to manipulate (or transform) the phase of part of the wavefront of each beam. The phase optics utilized may be discrete elements (e.g., glass coverslips), monolithic elements (fabricated to give the precise time delay/phase shift for a given wavelength), or an active or programmable phase modulator (e.g., liquid crystal device, 2-D ferroelectric device, electro-optic modulator). The affected beams may be combined to form the output vector beams, where the type of the vector beam will depend on the polarization and phase manipulation within the interferometer.

The setup is robust, and has exhibited passive phase stability (of fringes) for more than three days, making it an attractive light source for microscopy. Preliminary measurements indicate a significant improvement in the point spread function using the radial beam compared to the Gaussian beam.

In accordance with an example, provided is a method of generating a vector beam from an input beam, the method comprising: splitting the input beam into a first beam having a first polarization and a second beam having a second polarization; modifying at least one of the first beam and the second beam such that the first polarization and the second polarization are orthogonal to one another; forming a first semicircular beam pair having the first polarization and a first orientation; forming a second semicircular beam pair having the second polarization and a second orientation orthogonal to the first orientation; and combining the second semicircular beam pair and the first semicircular beam pair in phase to produce the vector beam.

In accordance with another example, provided is a method of forming a microscopy system for analyzing a sample material, the method comprising: generating the vector beam; and focusing the generated vector beam into an electromagnetically responsive substrate layer comprising the sample material.

In accordance with yet another example, provided is a method for affecting a magnetically responsive material, the method comprising: generating an output vector beam at least partially comprising an azimuthally polarized component; and focusing the generated output vector beam into the magnetically responsive material.

In accordance with yet another example, provided is a method of generating an optical vector beam comprising: transforming an input optical beam into at least two output beams; simultaneously coupling the at least two output beams into an interferometer; manipulating the polarization of each of the at least two output beams to form at least two polarization affected output beams; manipulating the phase of the at least two polarization affected output beams to form at least two phase affected output beams, wherein combining the at least two phase affected output beams produces the vector beam.

In accordance with another example, provided is a method of generating an optical vector beam comprising: transforming an input optical beam into at least two output beams; simultaneously coupling the at least two output beams into an interferometer; transforming the polarization of each of the at least two output beams to form at least two polarization affected output beams; and transforming the phase of the at least two polarization affected output beams to form at least two phase affected output beams, wherein combining the at least two phase affected output beams produces the vector beam.

In accordance with another example, provided is an apparatus for generating a vector beam, the apparatus comprising: a coupler positioned to couple two output beams into an interferometer having two beam paths; a polarization assembly positioned within the interferometer to transform at least one polarization of the two output beams, such that each output beam has an orthogonal polarization to the other output beam; and a phase plate assembly positioned to alter at least one phase profile of the two output beams, such that each output beam has an orthogonal semicircular phase pair to the other of output beam, and wherein combining the two output beams produces a vector beam.

In accordance with another example, provided is a method of illuminating a sample, the method comprising: a) generating a first radially polarized vector beam at a first frequency; b) generating a second radially polarized vector beam at a second frequency that is twice the first frequency, the second radially polarized vector beam being coherent to the first radially polarized vector beam; and c) focusing the first and second radially polarized vector beams to form an interference pattern at the sample. In some examples, a photolithographic mask is imaged at a photoresist serving as the sample. In some examples, a)-c) may be repeated to form a three-dimensional photolithographic structure within the sample.

BRIEF DESCRIPTION OF SEVERAL VIEWS OF THE DRAWINGS

FIG. 1 illustrates an interferometric optical system having a diffractive optical element as the beam splitter, where the system is capable of forming vector beams, in accordance with an example;

DETAILED DESCRIPTION OF AN EXAMPLE

Various techniques are described for forming various vector beams, for example, radially- or azimuthally-polarized light beams. The techniques may be implemented in robust ways, using passively phase stable interferometers that allow for stable operation over extended periods of time. The techniques, for example, may employ a diffractive optical element (DOE) interferometer that uses passive phase stable branches to create orthogonally polarized, and orthogonally phase-shifted pairs of semicircular halves (two semicircular beam pairs) that when combined produce a vector beam. The interferometer may be passively phase stable and robust, making it suitable for linear and nonlinear optical (super-resolution) microscopy, as well as other applications describe below. As will be appreciated, although example implementations are described, the techniques are not limited to the examples provided, but rather may be used in other applications and in other configurations.

Figure 2A:
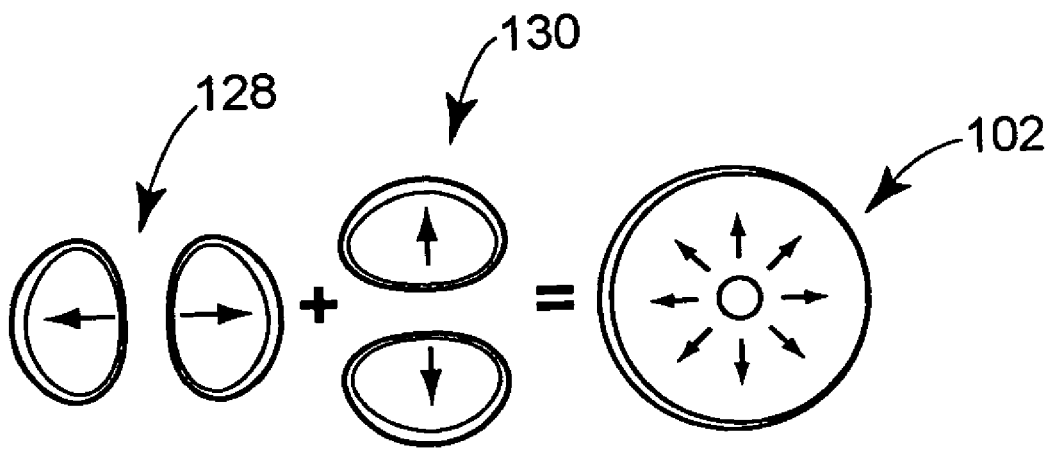
FIGS. 2A and 2B illustrate two example vector beams (radially polarized and azimuthally polarized, respectively) that may be formed by the system of FIG. 1.
Figure 2B:
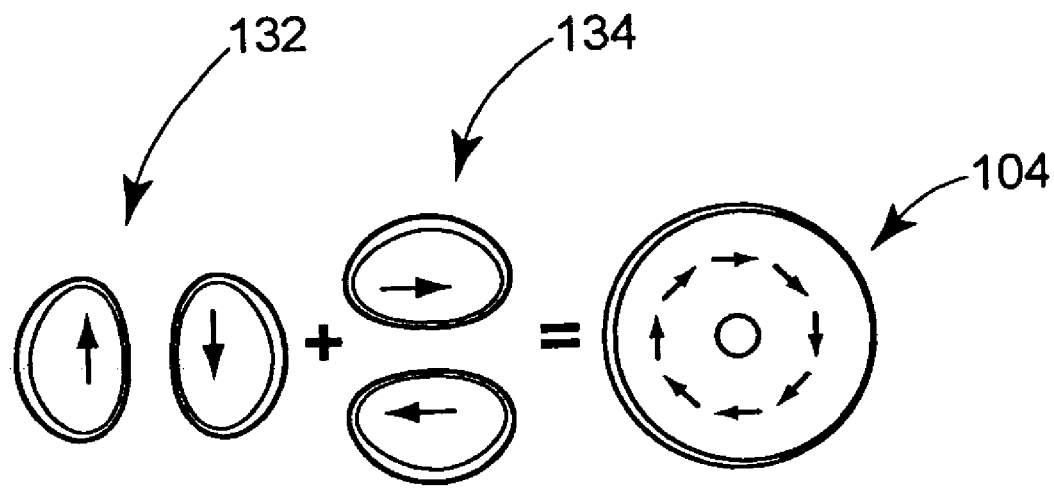

FIG. 1 illustrates an example optical apparatus 100 for producing a vector beam, such as a radially or azimuthally polarized beam. By way of background, radial and azimuthally polarized beams may be described as a superposition of two first order Hermite-Gaussian modes, $TEM_{10}$ and $TEM_{01}$, with zero relative phases. For the radial polarization case, e.g., the electric field representing this superposition is given by $$E(r,\theta)=E_o(r)[\cos(\theta)\hat{\chi}+\sin(\theta)\hat{y}],$$

where $E_o(r)$ is a radially-dependent complex amplitude, $\theta$ is the azimuthal angle, and $\hat{\chi}$ and $\hat{y}$ are the polarization directions. The $TEM_{10}$ and $TEM_{01}$ modes may have polarization directions parallel to an X-axis and Y-axis, respectively. Conceptually, an azimuthally polarized beam is like a radially polarized beam, but polarization at each point in the beam cross-section has been rotated 9020 from the radially polarized case. For the azimuthal beam, the polarization directions of the TEM modes (i.e., $\hat{\chi}$ and $\hat{y}$) are simply switched in the equation above. An example illustration of radially polarized light 102 and azimuthally polarized light 104 is illustrated in FIGS. 2A and 2B, respectively. As discussed further below, FIGS. 2A and 2B show the superposition of two orthogonally polarized $TEM_{01}$ modes to form radially (128 and 130) and azimuthally (132 and 134) polarized beams, also known as an azimuthally polarized donut beam and a radially polarized donut beam. In the illustrated example, each vector beam (radially and azimuthally) is formed by the superposition of two semicircular halves, linearly polarized, as shown.

The optical apparatus of claim 1 includes a laser source 106, which may be a source that produces continuous wave or pulsed coherent laser light, for example. The laser source 106 may be a source that produces incoherent or partially-coherent light. By way of example, not limitation, this light may contain visible, infrared, near-infrared, or ultraviolet energy. By way of example, not limitation, the laser source 106 may represent a broadband laser source, laser diode, or a light emitting diode in a highly reflective cavity. By way of further example, in an implementation the laser source 106 may be a Ti:Sapphire laser source (FIG. 4), e.g., one capable of producing sub-100 femtosecond-duration pulses. Such pulses may be provided at an 80 MHz repetition rate, and the pulses may be linearly polarized and spectrally centered at 800 nm wavelength, although examples herein are not limited to a particular wavelength range. Other example sources include a gas laser such as an Argon laser, a semiconductor laser, fiber laser, optical amplifier, or other laser source.

In the illustrated example, the laser source 106 produces a linearly polarized light beam 108 (polarized in the plane of the paper as indicated by the arrow). The light beam 108 is collected in a lens 110 and coupled to a beam splitter 112 that divides the beam 108 into output beams 114 and 116. In the illustrated example, and by way of example not limitation, the beam splitter 112 is a beam-splitting diffractive optical element (DOE), examples of which include the DOEs available from Holoeye Photonics AG of Berlin, Germany, which utilize a surface of complex microstructure etched in fused silica or embossed in polymer materials. The beam splitter 112 may instead be implemented via an SLM or diffractive grating capable of splitting the input beam 108 into at least two output beams. The splitter 112 may be a polarizing prism such as a Wollaston or Rochon prism, a non-polarizing prism such as a Fresnel biprism, or an acousto-optical modulator. Further still, the splitter 112 is illustrated as transmissive, e.g., a diffraction-based element, but the splitter 112 may be replaced with a reflection-based beam splitting element. Even further examples are provided below with reference to FIGS. 7A and 7B. These are provided by way of example not limitation. For explanation purposes the beam splitter 112 (combiner 138) is illustrated and described as a DOE; although, it is recognized that this element may represent another splitting (combining) element.

In the illustrated example, the system 100 produces the output vector beam via a DOE-based interferometer 113. The DOE 112 splits each pulse into the two output beams 114 and 116 (e.g., with a 10° angle between them), and each beam 114 and 116 is collimated via the same refractive optical element 118, an objective lens in the illustrated example. The lens 118 may operate as a passive phase stability element by collimating both beams 114 and 116 simultaneously and with the same phase delay, thereby leaving the two beams with synchronized phase in the DOE interferometer 113.

Each branch 119A and 119B of the DOE interferometer provides polarization and phase manipulation. The former may be achieved by polarization elements 120 and 122, respectively, that collectively form a polarization assembly 123. The polarization element 120, for example, may be half-wave plate set at a 45° angle with respect to the input polarization to rotate the input polarization 90°, i.e., out of the plane of the illustration in this example. The polarization element 122 may be set to produce an orthogonal polarization state to that formed by the element 120. For example, the element 120 may be identical to the element 122 but rotated to a 0° angle with respect to the input beam producing a polarized beam in the plane of the illustration like beam 108, but also ensuring temporal overlap of the light in each branch 119A and 119B. The output from each element 120 and 122 is a polarization affected version of the beams 114 and 116, respectively.

The polarization assembly 123 is illustrated and described as manipulating the polarization of input beams 114 and 116, e.g., rotating the polarization state of the beams. Other polarization manipulating techniques may be used. Alternatively, the assembly 123 could include polarization transforming elements or configurations, for example, with quarter wave plates capable of producing linearly polarized light from incident circularly polarized light or other polarization forming devices.

The optical device 100 may serve as either a radial or azimuthal beam generator depending on the setting of each of these polarization elements 120 and 122. For explanation purposes, the illustrated example provides a configuration to produce a radially polarized output vector beam.

The beam path 119a includes a phase plate 124 that, in the illustrated example, may subtend the incident wavefront into left and right semicircular halves, each having a polarization state like that of the output produced by the polarization element 120. Correspondingly, the path 119B includes a second phase plate 126 that may be generally the same as the phase plate 124 but that may subtend an incident wavefront into top and bottom semicircular halves, in the illustrated example. Within the Fourier (i.e., collimated) region of the DOE interferometer, the polarization of each beam 114 and 116 may be first rotated to achieve mutual orthogonality; and then a $\pi$-phase shift may be imparted to half of the wavefront of each beam by way of identical phase plates 124 and 126. The phase plates 124 and 126 form a phase plate assembly 127, which produces phase affected versions of the beams 114 and 116.

In reference to FIG. 2A, for example, the phase plate 124 may produce left and right semicircular halves, referenced 128, while the phase plate 126 produces the top and bottom semicircular halves 130, which may be combined to produce the radially polarized light 102. As illustrated in FIG. 2A, each semicircular half in the semicircular halves 128, 130 has the same linear polarization, but the polarizations are $\pi$ phase shifted. Such phase shift is provided by way of example, not limitation.

In contrast to the radially polarized light, to produce an azimuthally polarized light, each beam path 119A and 119B may instead produce semicircular halves with different polarization states. The left and right pair 132 may have vertically extending (in the illustration) polarization states, while the top and bottom pair 134 may have horizontally extending polarization states, to form the azimuthally polarized light 104.

The phase plates 124 and 126 may be achieved via known techniques. An example implementation uses a coverslip such as the coverslip 200 illustrated in FIG. 3. The coverslip 200 includes a first phase plate region 202 and a second, rotated or out-of-phase plate region 204. As illustrated, an input beam of a first input polarization, in this example, perpendicular to the axis of the coverslip 200, produces two output polarizations, each representing a different half of the semicircular halves. To provide temporal overlap each phase plate 124 and 126 would be formed of an identical coverslip 200, except each coverslip would be oriented to produce the desired left and right or top and bottom semicircular halves. Using the coverslip 200 formed of two plate regions, the coverslip 200 may be adjusted to affect the desired phase manipulation in each beam path 119A and 119B. By way of example, not limitation, 0.17-mm thick, glass coverslips that can be precisely rotated to adjust the path length (i.e., phase) difference may be used.

Although the example of FIGS. 1 and 2 are described with reference to passive phase shifting plates, the techniques are not limited to a particular phase shifting element. Furthermore, although, in the illustrated example, the phase plates 124 and 126 are described as affecting particular portions of the wavefront, phase plates or other phase manipulating elements may be used to manipulate arbitrary portions of the incident wavefront. In this way, many different phase affected versions of an incident beam may be formed. Further still, not only may phase manipulating elements be used, but also phase transforming elements may be used, e.g., to alter the entire phase profile of the incident beam. By way of example, actively tunable phase shifting elements, such as liquid crystal display (LCD) devices, may be used to manipulate the phase in each beam path 119A and 119B. The phase plate elements 124 and 126 may represent any active or programmable phase modulator (e.g., liquid crystal device, 2-D ferroelectric device, electro-optic modulator). Further still, although two phase plates 124 and 126 are shown, in some implementations, a single monolithic element (fabricated to give the precise time delay/phase shift for a given wavelength) that affects each beam 114 and 116 in a desired manner may be used instead.

The polarization in each semicircular half can be made to oscillate $\pi$ out-of-phase through control of the orientation of, hence distance traveled through, a coverslip in each semicircular half ($\approx 3°$ rotation equals $\pi$-phase shift). Therefore, the beam path 119A results in a $TEM_{10}$ mode, and the beam path 119B results in a $TEM_{01}$ mode. The beams in each path are provided to a second refractive optical lens 136, which combined with element 118 provides an overall passive phase stability system. The beams are then combined at a combining element, e.g., a second DOE 138 in the illustrated example, where combination occurs by satisfying phase-matching conditions. The beams may be combined by a DOE, diffractive grating, SLM, mirror, beam splitter, or other technique, including diffractive, refractive, and reflective devices. Further still, the lens 136 may be replaced with reflectors that reflect the generated beam back toward the laser source 106 to be split from the incident beam using a single non-polarizing filter or mirror, for example. In the illustrated example, the output from the DOE 138 is imaged by a lens 140 onto a camera 142, for example, a CCD camera that may be used to detect the beam profile for the output vector beam.

Figure 4:
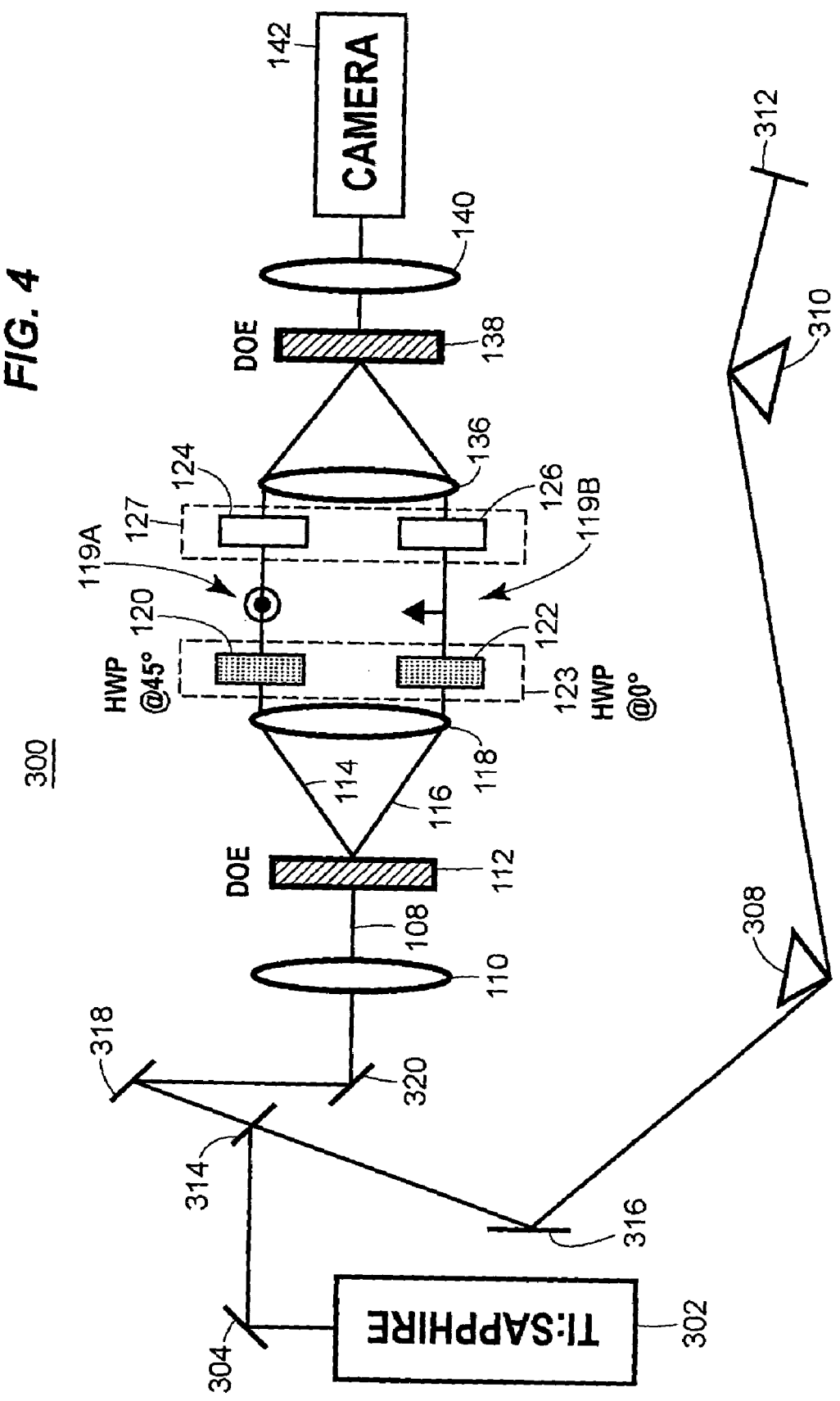
FIG. 4 illustrates an example implementation of the system of FIG. 1 with a Ti:Sapphire pulsed laser generator as the laser source.

FIG. 4 shows an example implementation of an optical system 300 having like elements to system 100, and thus sharing like reference numerals. In the system 300, however, the laser source 106 includes a Ti:Sapphire laser 302, e.g., as described above. The pulsed laser output from the Ti:Sapphire laser 302 is coupled (via a mirror 304) into a dispersion compensation cavity 306 that includes two prisms 308, 310. The cavity is bounded by mirrors 312 and 314, fully reflective and partially transmissive, respectively, along with a redirecting mirror 316 used in the illustrated example. The dispersion compensative output laser pulse is coupled into the system DOE interferometer via additional mirrors 318 and 320. It will be appreciated by persons of ordinary skill in the art that this configuration is provided by way of example and not limitation.

Figure 5A:
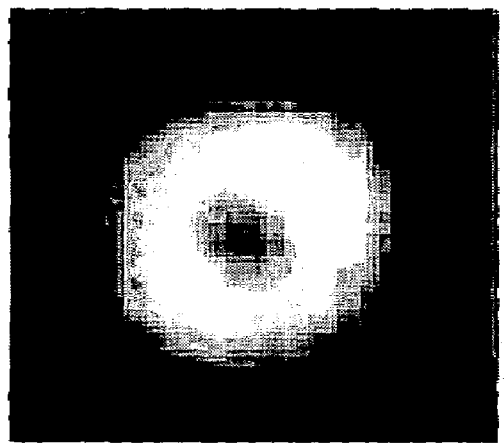
FIGS. 5A and 5B illustrate an intensity profile for a vector beam created by the system of FIG. 4.
Figure 5B:
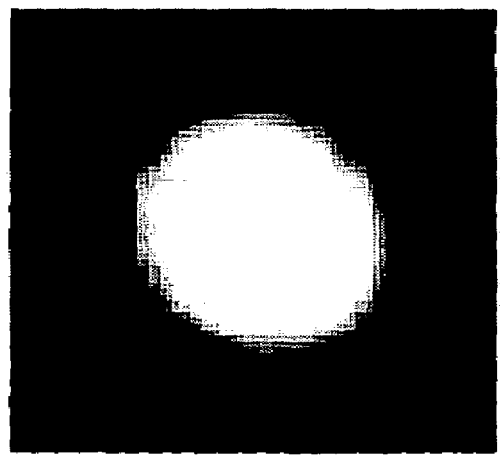

FIG. 5A shows a radially polarized beam that may be obtained from the system 300. One observes a doughnut-shaped intensity profile because of the mutual phase cancellation at the center of the combined beam from the DOE 138. For azimuthally polarized light, an identical image would be obtained (but not shown). The Gaussian beam profile in FIG. 5B is obtained by adjusting the phase plates 124 and 126 (e.g., coverslips) in each path 119A and 119B of the interferometer such that the wavefront of each beam's semicircular halves experience a 0° (rather than $\pi$) phase shift. To create azimuthally polarized light, the polarizations of beams 119A and 119B are simply switched.

Figure 3:
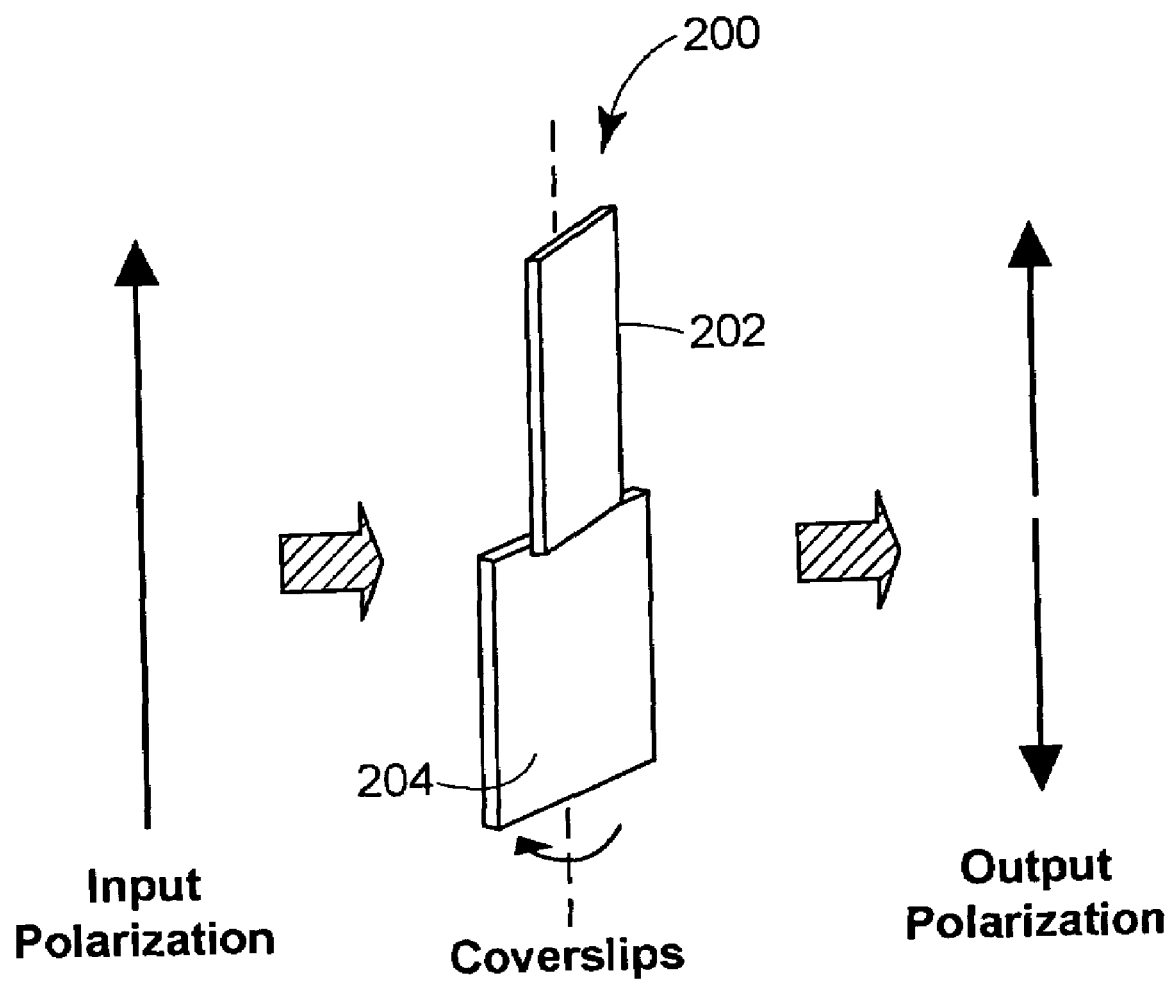
FIG. 3 illustrates an example phase manipulating element that may be used in the system of FIG. 1.
Figure 6:
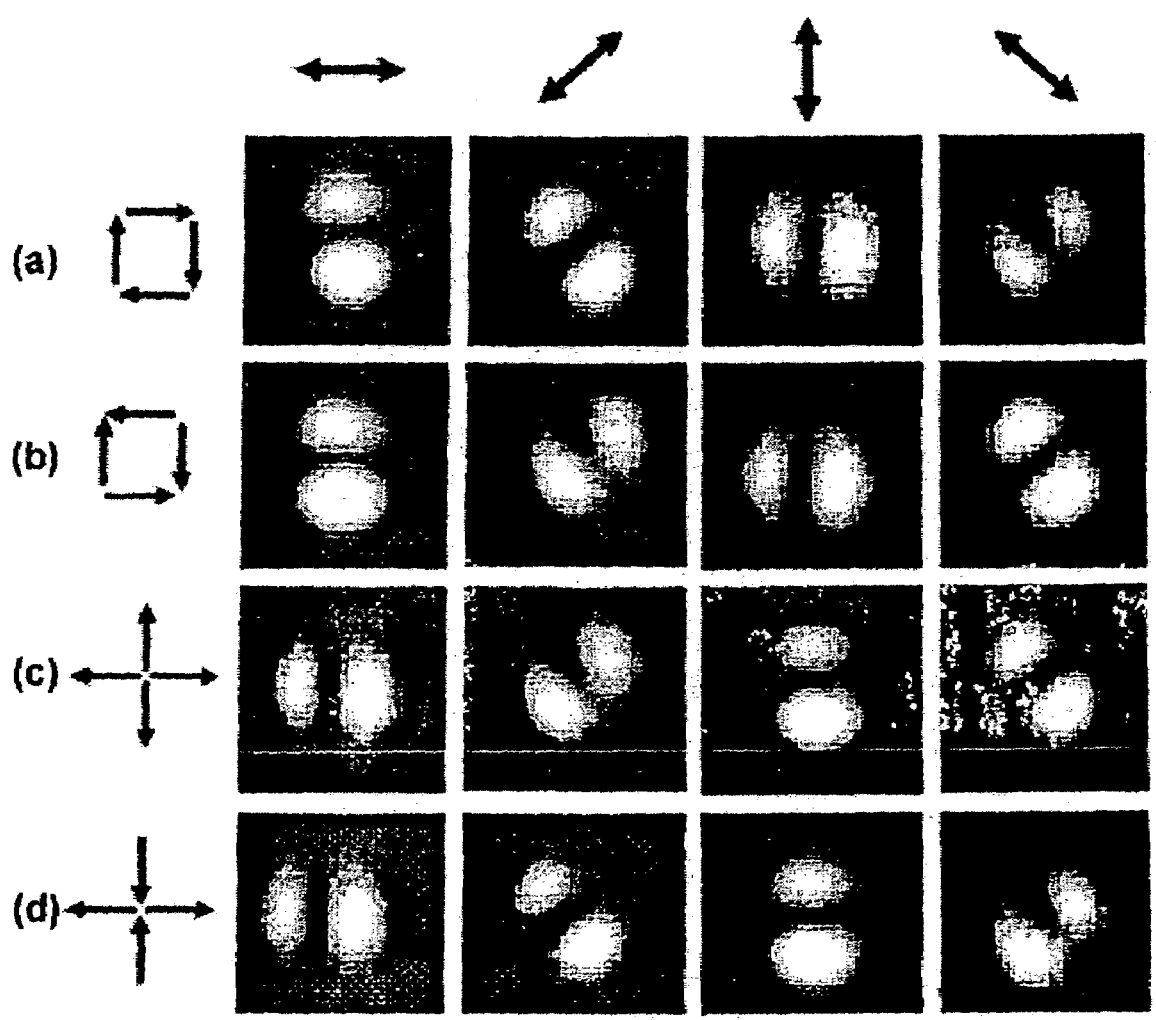
FIG. 6 illustrates a matrix of vector beams that may be created by the optical system of FIG. 1.

The systems 100 and 300 may be used to form vector beams other than radially and azimuthally-polarized beams. A linear polarization analyzer is used to distinguish between the radially and azimuthally polarized beams. The results for analyzer angles of 0°, 45°, 90°, and 135°, with respect to the horizontal, are shown in FIG. 6. The first column corresponds to the different vector beam states obtainable with the present setup. The remaining columns correspond to the intensity as a function of the pass axis of the analyzer as indicated by the arrows in the first row. Rows (a) and (c) are the azimuthal and radial vector beam states, respectively. The images are consistent with theory and with those obtained from alternative methods for generating radially and azimuthally polarized beams. By placing an additional coverslip in each path of the interferometer of the systems 100 and 300, for example, we can control the relative phase between the TEM modes and therefore create the other vector beam states. In other examples, one or both of the phase elements 124 and 126 may include two separate phase elements: one for controlling the relative phase beams 1 and 2, and one to control the relative phase between the semicircular halves of each (as illustrated in FIG. 3).

Rows (b) and (d) are similar to (a) and (c) but possess a relative phase shift of $\pi$ between the $TEM_{10}$ and $TEM_{01}$ modes, which is apparent only for the 45° and 135° projections. For the radially (azimuthally) polarized beam, the intensity null (dark lines in FIG. 6) is always perpendicular (parallel) to the transmission axis of the analyzer. For example, the horizontal setting of the analyzer (0° position) selects the $TEM_{01}$ mode for the azimuthal beam and the $TEM_{10}$ mode for the radial beam, and vice versa for the vertical setting of the analyzer. Thus, with either vector beam, the intensity lobes rotate with the axis of the analyzer as described above.

As illustrated in FIG. 6, the techniques provided here are able to create multiple vector beams, including radially and azimuthally polarized beams, as well as what are termed diagonal-azimuthally (row b) and quadrupolar-radially (row d) polarized vector beams.

There are two sources of interference in this system. The first comes from the DOE space-time interferometer analogous to Mach-Zehnder interferometry with pulses. The second occurs at the border between each semicircular half of each beam and is only apparent upon focusing. That is, the act of focusing beam 114 (or beam 116) mixes the wavevector components of each semicircular half in the focal region. If the polarization belonging to each semicircular half is oscillating in phase with the other, then the wavevectors add constructively at the focus. Conversely, components oscillating $\pi$ out-of-phase will result in destructive interference.

The techniques may result in longitudinally and transversely polarized E-field (electric field) and B-field (magnetic field) components at the focus when using high-NA optics, for example as the lens 140. For examples of radially polarized light, a longitudinally polarized E-field (electric field) is created, while for examples of azimuthally polarized light a longitudinally polarized B-field (magnetic field) is created. Such output vector beams may be used in known focusing applications, some examples of which are provided below.

Further still, by using passive phase stability elements, such as elements 118 and 136, example implementations have resulted in phase stability for more than three days with a configuration like that of FIG. 4 and then limited by laser drift. The interferometric technique allows each beam path 119A and 119B to experience similar phase perturbations, thus promoting this stability. Further stability control may be achieved by using temperature compensating elements, for example mounting assemblies 123 and 127 on a single or multiple temperature compensating assembly designed to impart the same temperature-dependent phase shift on each path 119A and 119B. Further stability may be achieved by forming the system in a compacted manner, reducing the affects of fluctuations of the laser source and air currents.

The techniques herein demonstrate the generation of radially and azimuthally polarized beams, as well as at least two additional vector beam states (quadrupolar-radial and diagonal-azimuthal), from a diffractive optical element interferometer. Depending on the settings of the phase control elements used, one can readily switch between these states. These are provided by way of example, as other vector beam states may be achieved through the addition of other polarization optics (e.g., a quarter-wave plate in place of the half-wave plates 120 and 122).

Figure 7B:
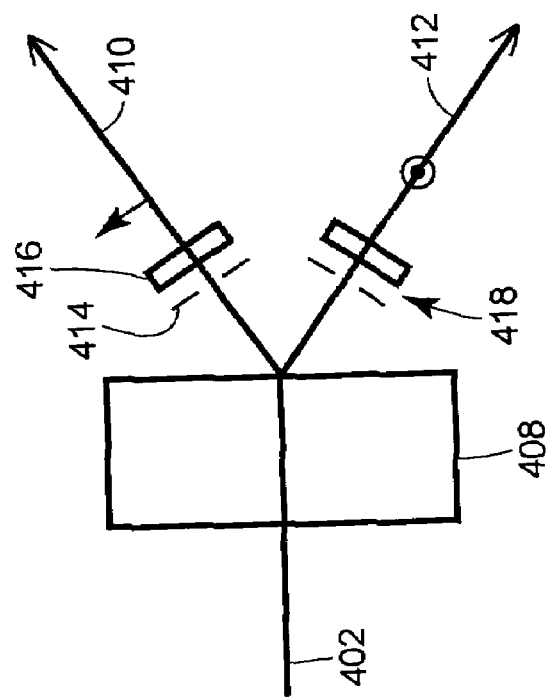
FIGS. 7A and 7B illustrate non-linear crystal examples that may be used to achieve beam splitting, in accordance with an example.
Figure 7A:
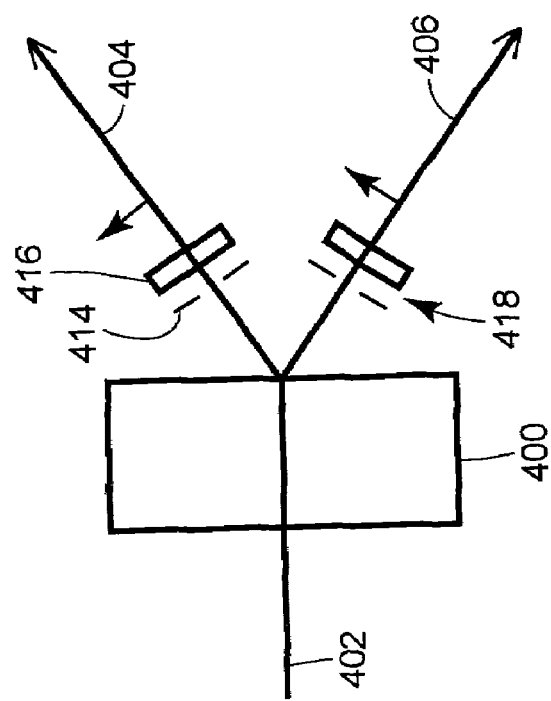

FIGS. 7A and 7B illustrate example techniques for forming the beam splitter 112 of FIG. 1. FIG. 7A illustrates a type-I non-collinear spontaneous parametric downcoversion technique that uses a non-linear crystal (NLC) 400 pumped by a laser beam 402. The NLC 400 may be a birefringent crystal, such as beta-barium borate (BBO), that is oriented to convert the linearly polarized incident beam 402 into two like polarization output beams 404 and 406, which could coincide with the beams 114 and 116 of FIG. 1. FIG. 7B illustrates a similar example, but with an NLC 408 oriented in a type-II non-collinear spontaneous parametric downcoversion configuration, thereby producing output beams 410 and 412 that are orthogonally polarized. In this instance, polarization elements like that of 120 and 122 may not be needed as the beam splitter has created the orthogonal polarization states. Such polarization elements may be still be used, however, for polarization and temporal phase alignment. An iris 414 may be used to prevent back reflected light from entering toward the laser source. Also, in the illustrated, a wavelength filter 416 is used to control the output wavelengths of the two output beams. This iris 414 and filter 416 are positioned orthogonal to the direction of propagation of beam 404. Another similar iris and filter pair 418 may be used for beam 406, although selectivity may be achieved through a single iris or iris and filter pair.

Further modifications include using optical elements in place of the lens 118 and 136, for example, reflective optical elements. This alternative may offer further reduction in material dispersion and spherical aberration, which may be especially useful when the laser source is using a femtosecond-pulse source.

Figure 8:
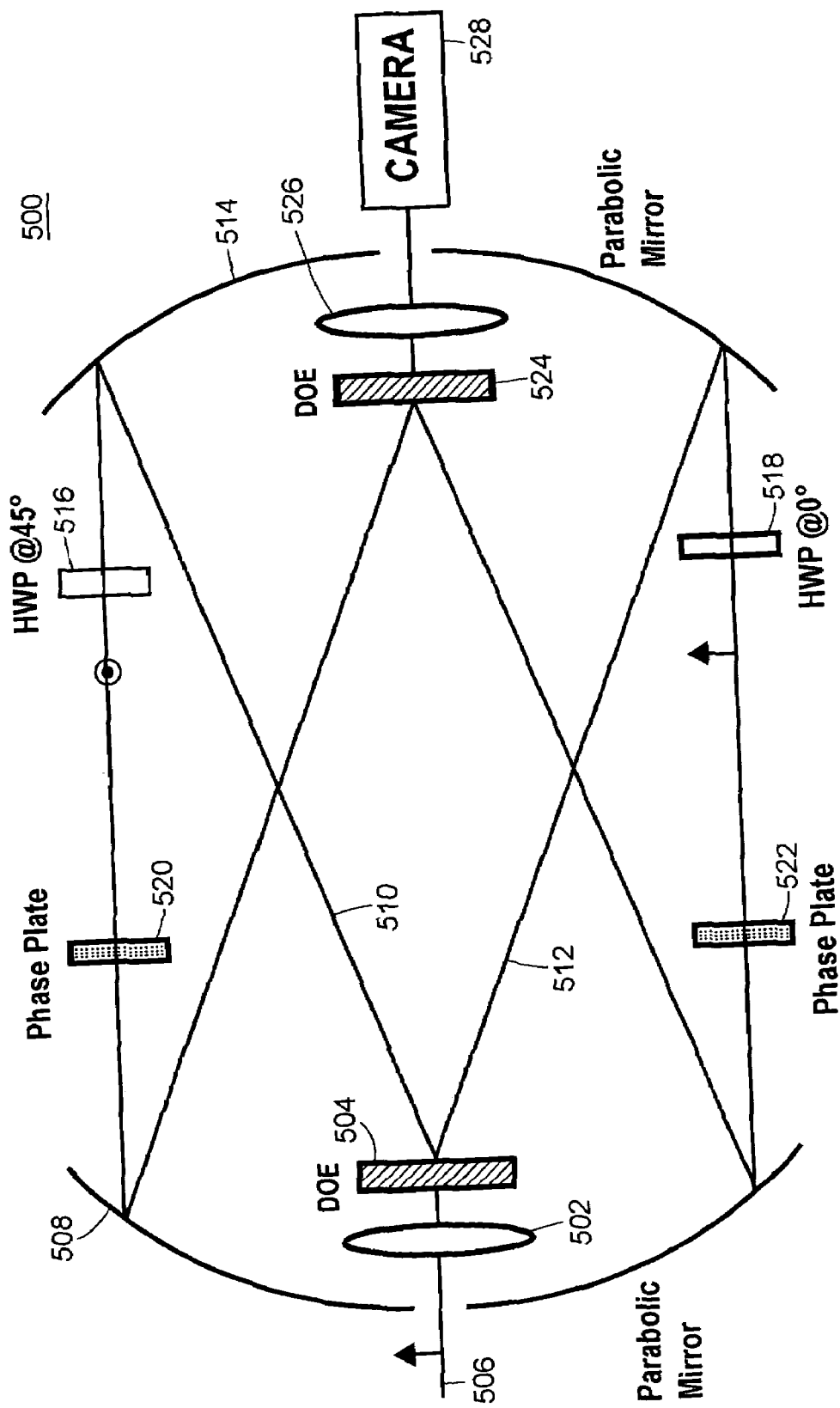
FIG. 8 illustrates an optical system capable of forming vector beams and using a reflective mirror system, in accordance with an example.

FIG. 8 illustrates another example optical apparatus for generating vector beams from an incident laser beam. A parabolic optical system 500 includes a focusing lens 502 and a DOE 504 that splits an input pulse into two beams as similar to the beam splitter 112 of FIG. 1. An input beam 506, which may be a sub-100 femtosecond-duration pulse for example as described above, has a linear polarization (in the illustrated example in the plane of the paper). To conserve space in the device 500, the beam 506 is received via an opening within a first mirror system 508, which is illustrated as a parabolic mirror but which may be replaced with a spherical mirror instead.

The two beams 510 and 512 from the DOE 504 propagate within the system 500 and reflect off of a second parabolic mirror system 514 which reflects each of the beams through polarization elements 516 and 518 respectively. The mirrors 508 and 514 form an overall passive phase stability system. As with the half wave plates 120 and 122 of FIG. 1, the polarization rotators 516 and 518 rotate the polarization of the input beam to form orthogonal linearly polarized states. The element 516 therefore may be a half wave plate rotated at a 45° angle in the illustrated example, and correspondingly the element 518 may be a half wave plate having a 0° angle of rotation. The resulting polarization affected beams have a polarization out of the paper (from element 516) and a polarization in the plane of the paper (from element 518) as with the original beam 506. Each beam propagates through a phase plate 520, 522 respectively which each may be formed in accordance with examples described above. The phase plates 520 and 522, for example, will subtend the wavefront of the input pulse into left and right semicircular halves and top and bottom semicircular halves, respectively, as described above. The parabolic mirror 508 reflects each of these semicircularly subtended beams into a second diffractive optical element 524 that combines the beams to produce the output vector beam which then may be focused by the lens 526 onto the camera 528. Similar to the input beam, the lens 526 in the illustrated example focuses the vector beam via a slot or opening in the parabolic mirror 514.

Figure 9:
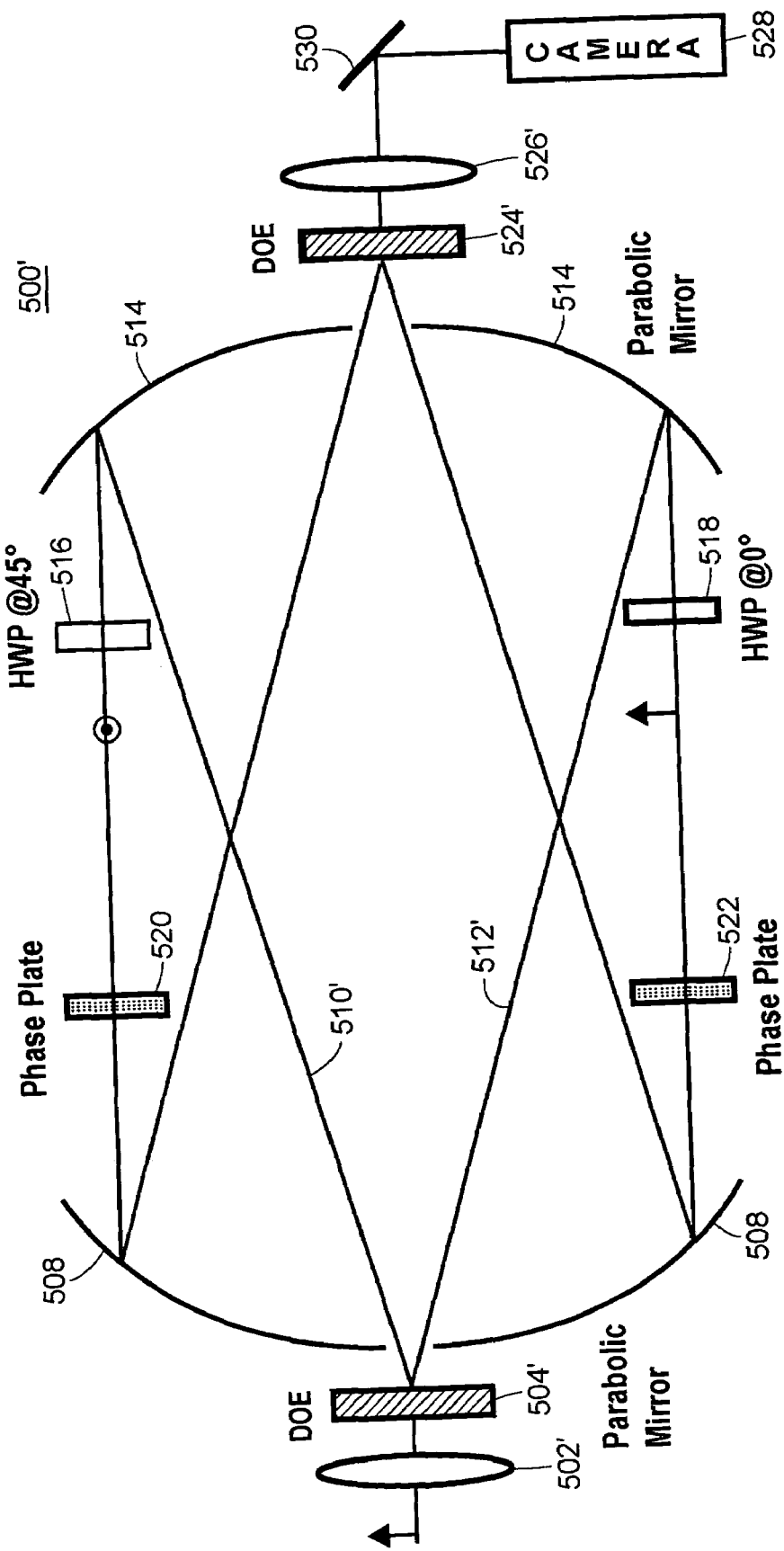
FIG. 9 illustrates another example optical system capable of forming vector beams and using a reflective mirror system.

FIG. 9 illustrates a similar example to that of FIG. 5 and therefore like reference numerals are used. FIG. 9, however, differs from FIG. 7 in the placement of the diffractive optical elements in the illustrated example. The lens 502 and DOE 504 of FIG. 7, for example, have been replaced with a similar lens 502' and DOE 504' which are positioned outside of the parabolic mirror 508. Similarly, a combining diffractive optical element 524' and corresponding focusing lens 526' are located on the outside of parabolic mirror 514 and in the illustrated example a mirror 530 is used to reflect the output beam into the camera 528.

Figure 10:
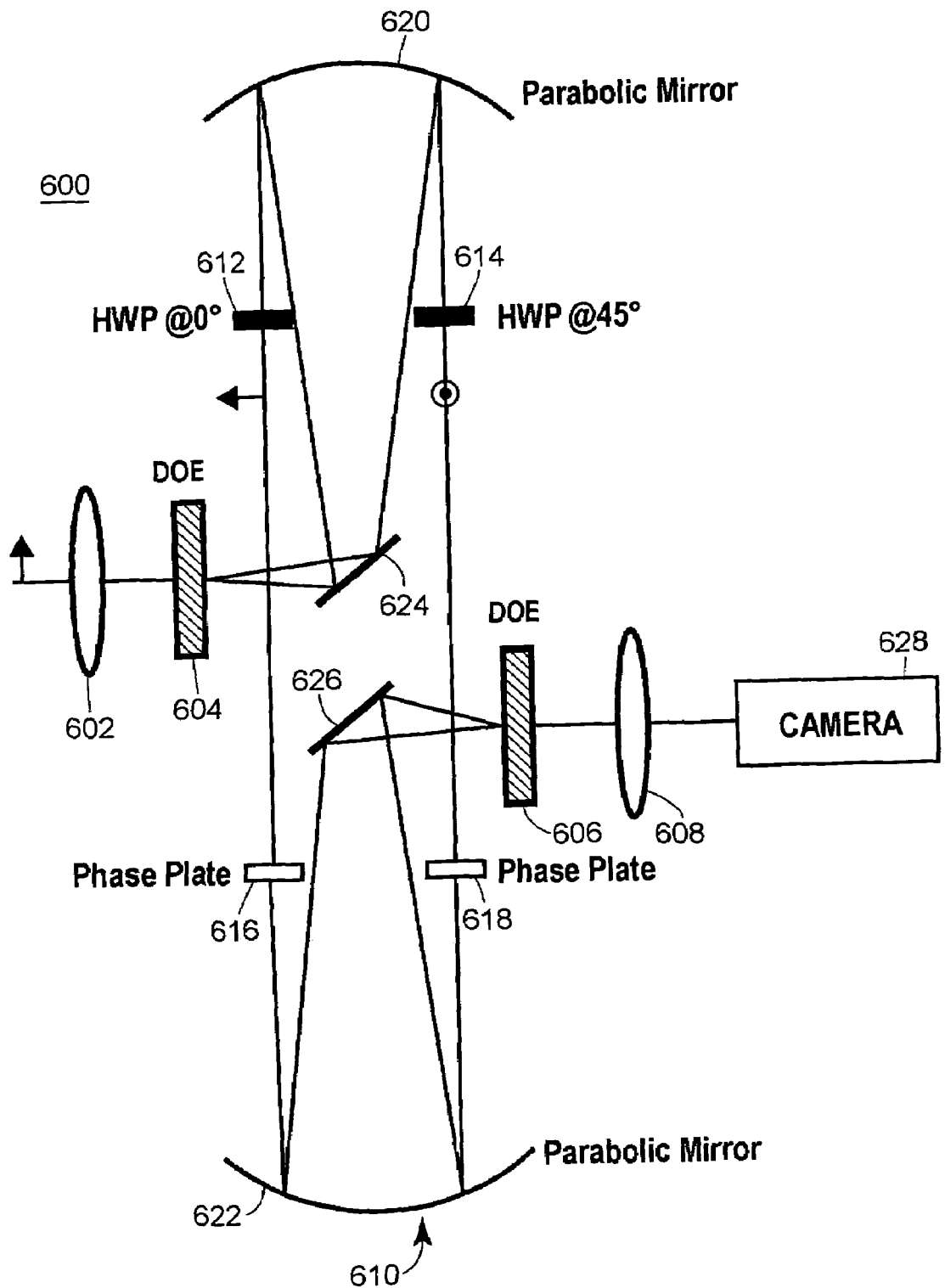
FIG. 10 illustrates another example optical system capable of forming vector beams and using a reflective mirror system.

FIG. 10 illustrates another example optical system 600 for forming radially or azimuthally polarized vector beams. The optical system 600 includes a first focusing lens 602 and DOE 604 similar to those described above. The system 600 also includes a second DOE 606 identical to DOE 604 in the illustrated example and an output focusing lens 608. A two-mirror optical system 610 is used to create the two orthogonally polarized and orthogonal semicircularly subtended beams that are combined by the DOE 606 to form a vector beam. The system 610 includes two polarization rotator elements, e.g., half-wave plates 612 and 614, similar to those described above. Correspondingly, the system 610 includes phase plates 616 and 618 designed to produce the subtended semicircularly divided beams. These elements are positioned within a parabolic mirror cavity formed of a first parabolic mirror 620 and a second parabolic mirror 622. The parabolic mirror 620 is positioned relative to the DOE 604 such that the two beams created by the DOE 604 when reflected off of a first mirror 624 are reflected off of the parabolic mirror in a collimated configuration incident on the polarization rotators 612 and 614. Similarly, parabolic mirror 622 is aligned with respect to the DOE 606 to reflect the received collimated light off of an output mirror 626 for combination at the DOE 606. The DOE 606 therefore produces the vector beam, and in the illustrated example that beam is focused via lens 608 into a camera 628.

The formation of vector beams through a two-path interferometric technique such as those described above may have numerous advantages over those conventional systems that rely upon a multistage single path configuration. For example, some have proposed placing two polarization converters in a single beam path, each converter containing an isotropic/anisotropic material pair. The first converter produces an intermediate polarization state, which is coupled, along the same path, to the second converter which produces the final vector beam polarization state. These isotropic/anisotropic pairs may limit the viability of the system for certain pulsed laser applications due to the material dispersion that a pulse would experience traveling through the different material layers forming each isotropic/anisotropic pair. In contrast, by splitting an input beam into different paths, like the example of FIG. 1 described above, each path may be dispersion matched to the other path, thus allowing for the use of short pulse input beams without detrimental material dispersion. By using coverslips that create phase differences through relative tilting between coverslip halves instead of through isotropic/anisotropic material differences, shorter, more intense pulse vector beams may be formed. Of the many benefits of being able to produce short (e.g., sub 100 fs) pulsed vector beams include applications such as the two-photon optical lithography discussed below in reference to FIG. 12.

Additionally, polarization tunability is improved through the use of a two-path interferometry technique. With a two-path configuration, one can adjust the relative phase between the polarization components combined to form the vector beam by simply adjusting one of the coverslips in one of the two beam paths (e.g., path 119a or 119b). Or the polarization can be adjusted by inserting at least one additional coverslip into at least one of the paths of light and rotating that coverslip, such as discussed in paragraph above. In either example, the system is able to quickly and elegantly change from one output vector beam to another.

These tunability advantages may translate into faster control operation and certainly faster switching from one polarization state to another. For example, because there is no mechanism of adjusting relative phases, single path configurations may require that all the converters along the single path be changed together, in material and/or orientation, to affect at least certain polarization state changes. With a two-path configuration, a system may be designed to readily switch polarizations, for example, between polarization states "(a)" and "(b)" of FIG. 6, by simply adjusting the relative phase between the two separate beam paths.

In general, there are numerous applications of optical vector beams. The applications can be divided into those that use the generated electric E-field (electric) produced at the focus and those that use the B-field (magnetic). Some examples are listed below.

EXAMPLE B-FIELD APPLICATIONS

The vector beams once formed may be used in any number of applications, examples of which include microscopy, including multiphoton microscopy, laser writing, and as a laser tip probe. With azimuthally polarized beams focused using high-NA optics (e.g., 0.75 or higher, such as 0.75 to 1.65), a tightly-focused longitudinally polarized (AC) B-field can be acheived. This AC B-field may be converted to a DC B-field by way of optical rectification.

Example applications using the DC magnetic field are numerous.

An example application is in magnetic storage applications, where the techniques may be used in computer hard drive applications. An azimuthally polarized focused beam, assisted by optical rectification, may produce the necessary B-field strength (coercivity) to read and/or write (in 1, 2, or 3-D through a multifocal, confocal, or holographic approach) into magnetic thin film hard drives. With the tight focusing of the B-field, especially along the heretofore expanded z-axis of the focused beam, three-dimensional magnetic writing/storage may be achieved with higher accuracy and greater overall storage capacity. The azimuthally polarized beam may be focused more exactly along the z-axis due to the tight focusing capability. This may increase the overall read/write speed of such systems as well as the storage capacity and allow optical addressing of magnetic media. Integration with optical circuits constructed-from photonic crystal structures will be enhanced as the optical vector beam functions as an opto-magnetic transducer.

Another potential application is in the field of spintronics. In this case, a localized B-field, produced by an azimuthally polarized vector beam assisted by optical rectification, can be used to selectively control the relative orientation of individual electron spins (usually into a binary system of "up" or "down", equivalent to bit "1" or "0") in a device (magnetic transistor), and hence magnetically control the electrical resistance of a device. This may be used to optically address magnetic memory storage devices, and can revolutionize the technology of giant magnetoresistive/spin valve sensors used in magnetic hard drives.

Another example is the excitation of magnetic dipole transitions of materials with high spatial resolution (voxel)<1 μm×1 μm×1 μm.

Another example is using a z-polarized B-field, assisted by optical rectification, to create an entangled spin state in, for example, an electron trapped in a quantum dot. This will have significance in the field of quantum computing where utilizing the spin degree of freedom is less susceptible to decoherence effects than using charge.

EXAMPLE E-FIELD APPLICATIONS

An example application is in improving spatial resolution in microscopy (linear and nonlinear) especially using radially polarized light. Another example is in using the vector beam technique as the front end to generate the optical beam for all conventional linear, confocal, and nonlinear optical microscopes.

Yet another example is to use a vector beam (particularly radially polarized light) for super-resolution (e.g. 4-Pi) microscopy.

Another example is generating a longitudinally polarized beam at the focus of a microscope.

Another example is to generate optical beams with angular momentum.

Another example is in determining a three-dimensional orientation dipole moment of a single molecule. A z-polarized E-field may be used in conjunction with x- and y-polarized components to determine the absorption or emission dipole moment of the molecule. Measuring field emissions from dipole resonances along each of the component planes would yield a three-dimensional depiction of the dipole moment.

Another example is to use vector beams, such as radially polarized light, to exploit the plasmon resonance of metallic nanoparticles; e.g., optical trapping and optical tweezing of metallic nanoparticles. Control of these particles may lead to guided assembly of three-dimensional nanostructures. In some examples, field-induced metallic nanoprobe enhancements may be achieved by forming a local electric field at the apex of the nanoprobe. The techniques may be used to increase the resolution in apertureless near-field scanning optical microscopy or to increase trapping strength of nanometric optical tweezers.

Another example is to use the on-axis null generated by focused azimuthally polarized light to trap and manipulate metallic particles up to microns in diameter.

Another example is to use the enhanced z-polarized field from focused radially polarized light to trap metallic particles up to microns in diameter.

Another example is to perform orientational imaging of nanoparticles by illuminating them with vertical, horizontal, and radially-polarized illumination. For example, the spatial orientation of a 50 nm single gold nanorod in a polyvinylpyroolidone (PVP) polymer has been determined using a Nikon inverted microscope to image the particle at each of the three polarization states. The resulting images (e.g., showing an illumination in the horizontal- and radially-polarized instances, but none in the vertical) indicated the orientation of the nanorod in a Cartesian coordinate system (e.g., showing no extension along the vertical axis).

Another example is to use the spin angular momentum from circularly polarized vector beams to enable controlled rotations of particles in an optical trap.

Another example application is in femtosecond pulse shaping for quantum control. A z-polarized E-field of femtosecond laser pulses may be combined with transverse field components to enable full three-dimensional control of light-matter interactions, thus extending conventional techniques for adaptive quantum control.

Another example is to generate optical vector beams for enhanced spatial resolution for applications in optical lithography; one embodiment of this scheme can increase the spatial bandwidth of an optical imaging system by combining the interference of at least 2 radially polarized beams (either laterally or axially or both) with multiphoton excitation (e.g., 2-photon excitation) of photoresist; the inherent confocality of such a system can lead to the creation of three-dimensional photolithographic structures.

EXAMPLE

Figure 11:
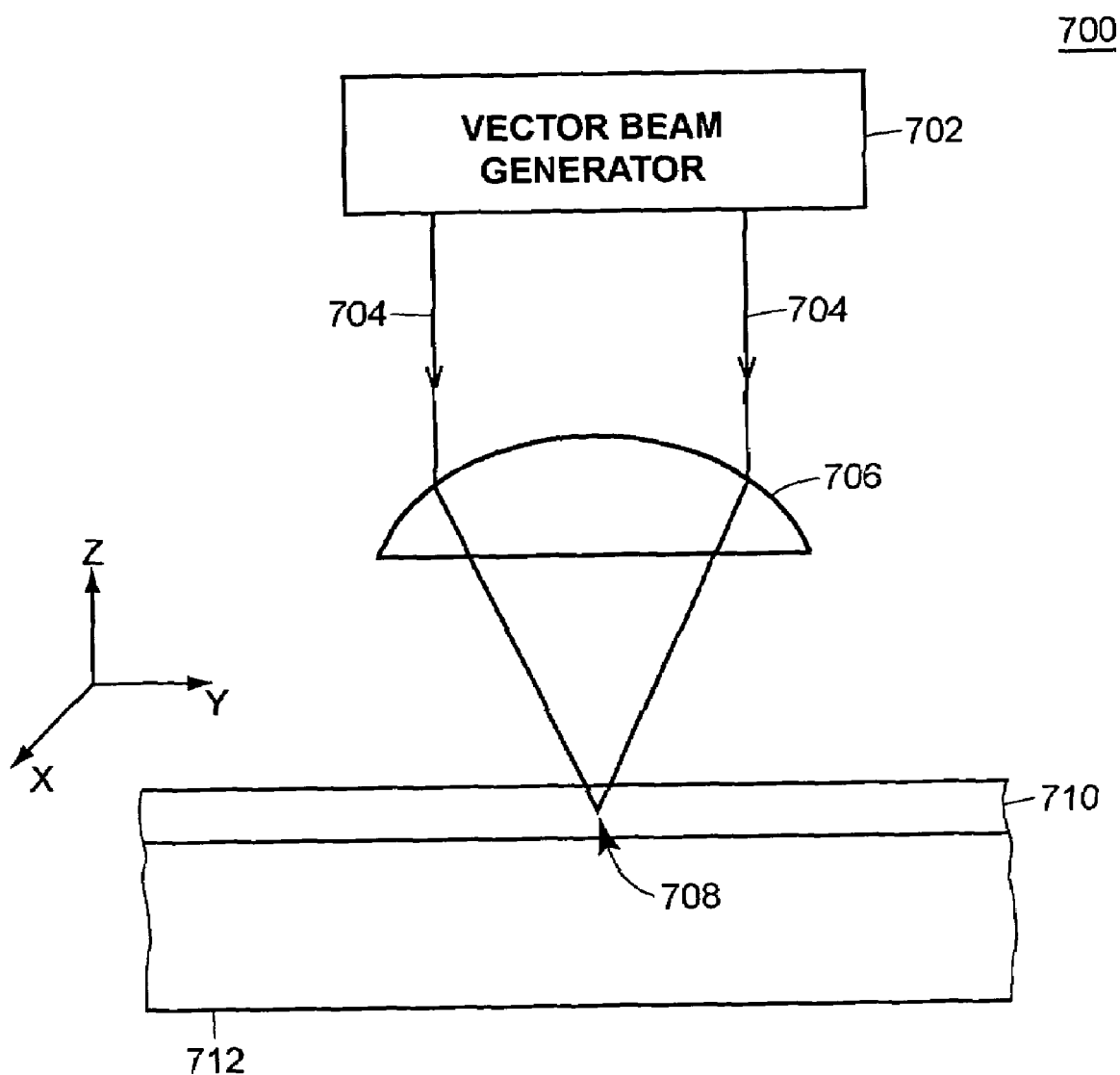
FIG. 11 illustrates an example focusing application using a vector beam generator, in accordance with an example.

FIG. 11 illustrates a focusing apparatus 700 that includes a vector beam generator 702 that may be implemented in accordance with the techniques described above. An output vector beam 704 is coupled to a focusing assembly formed of an objective lens 706, which may be a high-numerical aperture solid hemispherical or other lens or collection of lens elements. In the illustrated example, the vector beam 704 is focused to a focus region 708 in an affected substrate layer 710 on a substrate layer 712. The affected layer 710 may represent an electromagnetically responsive layer, such as a magnetic storage medium that is alterable in response to the application of a magnetic field (B-field). More generally, the layer may represent any magnetic field response material including materials with excitable magnetic dipoles transitionable with high spatial resolution. In the example of an azimuthally polarized vector beam 704 (assisted by optical rectification) and a magnetic storage medium, the beam 704 may be focused within three dimensions within the layer 710 via adjusting the lateral position of the lens 706 (X-position and Y-position) and its focusing position (along a Z-axis), thereby allowing for three dimensional writing or reading of data.

The layer 710 may alternatively be an electric field responsive material, including an optical substrate, and the focused vector beam may be used in such applications as laser writing within the substrate. Alternatively, the apparatus 700 may be part of a microscopy system and the layer 710 a substrate containing a biological, chemical, pharmaceutical, semiconducting or other material under examination.

An optical lithography system is one that uses light to transfer a prescribed pattern to a photoresist film in contact with a semiconductor wafer or similar substrate. For image-based lithography, an entire pattern may be transferred in a single exposure. For scanning or direct write lithography, the pattern is sequentially applied, image point by image point, or image line by image line. For scanning lithography, a polarized laser is often used. An example application of the described techniques to optical lithography is the two-photon lithography system described below.

Figure 12:
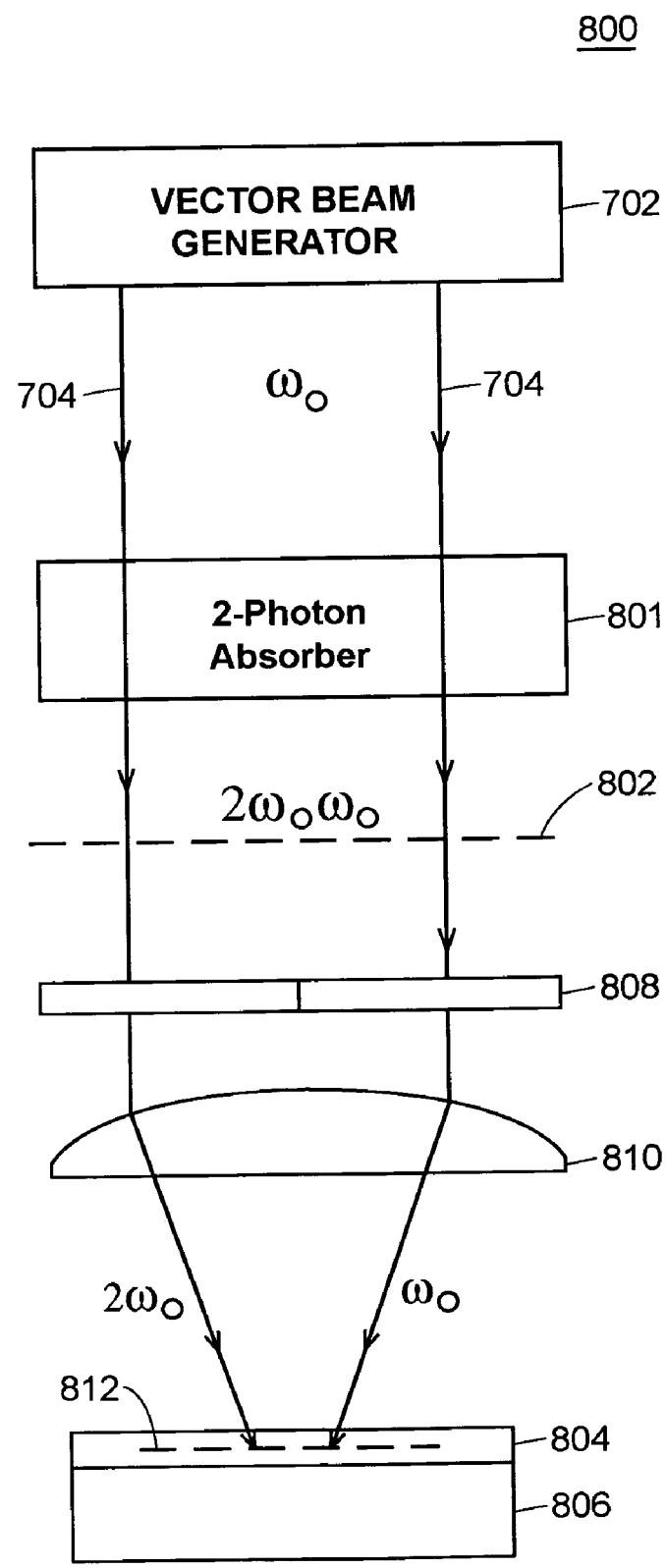
FIG. 12 illustrates an example photolithography imaging application in accordance with an example.

FIG. 12 illustrates an example implementation of an optical lithography focusing system 800, employing two radially polarized beams in an interference imaging arrangement. The system 800 may be modified by for example illuminating the mask 802 by two separate, coherent radially polarized light beams from the generator 702, one being laterally aligned and the other axially aligned, and one being a two-photon beam $2\omega_0$ (produced by a two-photon absorber 801) and the other having a different frequency component. The beam (with combined components $2\omega_0$ and $\omega_0$) illuminated onto the mask 802 is passed through a wavelength filter 808 that separates this incident beam into a $2\omega_0$ beam component and $\omega_0$ beam component, that is focused by an objective lens 810 to form a mask interference pattern 812 in an affected substrate layer 804 of the substrate layer 806. The frequency component of the second beam may be shifted from $\omega_0$ by a difference frequency value $\delta$ to produce a further super-resolution image from the two-photon interference using conventional techniques such as those of Yablonovitch et al., "Optical projection lithography at half the Rayleigh resolution limit by two-photon exposure," Optical Engineering, Vol. 38, No. 2, 334-338, February 1999.

Numerous modifications to the above techniques will be apparent to persons of ordinary skill in the art. For example, while detailed descriptions of some example techniques for forming a vector beam have been described above and in many different example implementations, this application is not limited to those particular formation techniques. Other vector beam formation techniques, such as those described in U.S. Publication No. 2005/0195480, which is expressly incorporated herein by reference, may be used in the various example implementations described herein, both for the B-field and the E-field.

Although the foregoing sets forth a detailed description of numerous different embodiments, it should be understood that the scope of the patent is defined by the words of the claims set forth at the end of this patent. The detailed description is to be construed as providing examples and does not describe every possible embodiment because describing every possible embodiment would be impractical, if not impossible. Numerous alternative embodiments could be implemented, using either current technology or technology developed after the filing date of this patent, which would still fall within the scope of the claims.

Thus, many modifications and variations may be made in the techniques and structures described and illustrated herein without departing from the spirit and scope of the present claims. Accordingly, it should be understood that the methods and apparatus described herein are illustrative only and are not limiting upon the scope of the claims.

The invention claimed is:

1. A method of generating an optical vector beam comprising:
   transforming an input optical beam into at least two output beams, wherein the at least two output beams have the same polarization;
   simultaneously coupling the at least two output beams into a single coupler that is a passive phase stability element collimating the at least two output beams for propagation along the same direction of an interferometer;
   after said coupling, manipulating the polarization of each of the at least two output beams to form at least two polarization affected output beams each having a different polarization and each propagating along the same direction of the interferometer; and
   manipulating the phase of the at least two polarization affected output beams to form at least two phase affected output beams each propagating along the same direction of the interferometer, wherein combining the at least two phase affected output beams produces the vector beam.

2. The method of claim 1, wherein the vector beam comprises radially polarized light.

3. The method of claim 1, wherein the vector beam comprises azimuthally polarized light.

4. An apparatus for generating a vector beam, the apparatus comprising:
   a coupler positioned to couple two output beams of the same polarization into an interferometer having two beam paths that are parallel to each other;
   a polarization assembly positioned within the interferometer to receive each of the two output beams and transform at least one polarization of the two output beams, such that each output beam has an orthogonal polarization to the other output beam; and
   a phase plate assembly positioned to alter at least one phase profile of the two output beams, such that each output beam has an orthogonal semicircular phase pair to the other of output beam, and wherein combining the two output beams produces a vector beam, wherein the two output beams propagate parallel to one another and in phase with one another while propagating from the polarization assembly through the phase plate assembly.

5. The apparatus of claim 4, further comprising a beam splitter positioned to split an input beam into the two output beams.

6. The apparatus of claim 5, wherein the beam splitter is a diffractive optical element.

7. The apparatus of claim 5, wherein the beam splitter is a spatial light modulator.

8. The apparatus of claim 5, wherein the beam splitter is a diffractive grating.

9. The apparatus of claim 5, wherein the beam splitter is a type I non-collinear spontaneous parametric downconverting crystal.

10. The apparatus of claim 5, wherein the beam splitter is a type II non-collinear spontaneous parametric downconverting crystal.

11. The apparatus of claim 5, wherein the beam splitter is a polarizing prism.

12. The apparatus of claim 5, wherein the beam splitter is a non-polarizing prism.

13. The apparatus of claim 5, wherein the beam splitter is an acousto-optical modulator.

14. The apparatus of claim 5, wherein the input beam is a linearly polarized beam.

15. The apparatus of claim 5, wherein the input beam is a partially polarized beam.

16. The apparatus of claim 5, wherein the phase plate assembly comprises two glass optical slabs, one in each of the beam paths.

17. The apparatus of claim 5, wherein the phase plate assembly comprises two monolithic elements, one in each of the beam paths.

18. The apparatus of claim 5, wherein the phase plate assembly comprises two active phase modulators, one in each of the beam paths.

19. The apparatus of claim 5, wherein the phase plate assembly comprises two programmable phase modulators, one in each of the beam paths.

20. The apparatus of claim 5, wherein the polarization assembly comprises two half wave plates, one in each of the two beam paths, wherein the half wave plates are oriented such that one of the two half wave plates produces a polarization state orthogonal to a polarization state produced by the other one of the two half wave plates.

21. The apparatus of claim 5, wherein the coupler is a refractive optical lens.

22. The apparatus of claim 5, wherein the coupler is a reflective mirror.

23. The apparatus of claim 22, wherein the reflective mirror is a parabolic mirror.

24. The apparatus of claim 22, wherein the reflective mirror is a spherical mirror.

25. The apparatus of claim 5, wherein the vector beam comprises radially polarized light.

26. The apparatus of claim 5, wherein the vector beam comprises azimuthally polarized light.

* * * * *